United States Patent
Kawaguchi et al.

(10) Patent No.: US 6,818,945 B2
(45) Date of Patent: Nov. 16, 2004

(54) SEMICONDUCTOR DEVICE

(75) Inventors: Yusuke Kawaguchi, Kanagawa (JP); Syotaro Ono, Kanagawa (JP); Akio Nakagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 10/404,141

(22) Filed: Apr. 2, 2003

(65) Prior Publication Data
US 2004/0150036 A1 Aug. 5, 2004

(30) Foreign Application Priority Data
Feb. 3, 2003 (JP) ........................... 2003-026086

(51) Int. Cl.$^7$ .................................... H01L 29/72
(52) U.S. Cl. .................. 257/328; 257/491; 257/496; 257/329; 257/330
(58) Field of Search .............................. 257/328, 329, 257/330, 491, 496

(56) References Cited

U.S. PATENT DOCUMENTS 6,153,896 A  11/2000 Omura et al.

2002/0070418 A1 * 6/2002 Kinzer et al. ............... 257/496

* cited by examiner

Primary Examiner—Edward Wojciechowicz
(74) Attorney, Agent, or Firm—Oblon, Spivak, McClelland, Maier & Neustadt, P.C.

(57) ABSTRACT

A semiconductor device according to one embodiment of the present invention includes: a semiconductor substrate of a first conductive type; a semiconductor layer of the first conductive type formed on the semiconductor substrate; a base layer of a second conductive type formed on the semiconductor layer; a plurality of columns of stripe trenches formed at predetermined intervals from a surface of the base layer by a predetermined depth; insulating films formed on side surfaces and bottoms of the trenches, respectively; source layers of the first conductive type formed on surface layer portions of the base layer between the trenches, respectively; stripe contact layers of the second conductive type formed each at centers of the surface layer portions of the base layer between the trenches, respectively; a gate electrode formed in every other trench among the plurality of columns of trenches; source electrodes formed in the trenches other than the trenches in which the gate electrodes are formed and on the source layers and the contact layers, respectively; and a drain electrode formed on a rear surface of the semiconductor substrate.

15 Claims, 5 Drawing Sheets

SEMICONDUCTOR DEVICE

CROSS-REFERENCE TO RELATED APPLICATION

This application is based upon and claims the benefit of priority from the prior Japanese Patent Application No. 2003-026086, filed on Feb. 3, 2003; the entire contents of which are incorporated herein by reference.

BACKGROUND OF THE INVENTION

1. Field of the Invention

The present invention relates to a semiconductor device, and particularly relates to a vertical trench MOSFET.

2. Related Background Art

Power MOSFETs have been increasingly used in not the only high current, high withstand voltage switching power supply market but also the energy saving switching market for mobile communications equipment including notebook personal computers and the like. For such purposes, the power MOSFET is often used in a power management circuit, the safety circuit of a lithium ion battery, or the like. Therefore, in view of realizing low driving voltage, low ON resistance and low switching loss by which directly driving of the power MOSFET with a battery voltage is enabled, it is required to further decrease the capacitance between the gate and drain of the power MOSFET.

As an index which represents element characteristics for evaluating the decrease of the driving voltage, that of the ON resistance, and that of the switching loss of the element, the product Ron·Qgd of the ON resistance Ron and the gate-drain electric charges Qgd during switching is employed. The element characteristic index Ron·Qgd is the product of the ON resistance and the gate-drain electric charges Qgd during switching. Due to this, the lower the index is, the larger the decrease of the driving voltage, that of the ON resistance, and that of the switching loss of the element become.

FIG. 1 is a cross-sectional view showing a first example of conventional trench gate type power MOSFETs. FIG. 2 is a plan view of the surface of the semiconductor substrate of the first example of the conventional trench gate type power MOSFETs. It is noted that FIG. 1 is a cross-sectional view taken along line DD' of FIG. 2 and that FIG. 2 is a plan view of the semiconductor substrate surface in a state in which source electrodes on the semiconductor substrate surface are eliminated so as to facilitate understanding.

The conventional trench gate type power MOSFETs include an n$^+$ type semiconductor substrate 1, an n$^-$ type semiconductor layer 2 formed on the n$^+$ type semiconductor substrate 1, a p type base layer 3 formed on the n$^-$ type semiconductor layer 2, a plurality of columns of stripe trenches 4 formed at predetermined intervals from the surface of the p type base layer 3 by a predetermined depth, insulating films 5 formed on the side surfaces and bottoms of the respective trenches 4, n$^+$ type source layers 6 formed in the surface layer portions of the p type base layer 3 between the respective trenches 4, stripe p$^+$ contact layers 7 formed at the center of the surface layer portions of the p type base layer 3 between the respective trenches 4, gate electrodes 8 formed in the respective trenches 4, source electrodes 9 formed on the respective n$^+$ type source layers 6 and the p$^+$ type contact layers 7, and a drain electrode 10 formed on the rear surface of the n$^+$ type semiconductor substrate 1.

The n$^-$ type semiconductor layer 2 consists of, for example, an epitaxial layer formed by epitaxial growth. As shown in FIG. 1, for example, each stripe trench 4 has a depth from the surface of the p type base layer 3 to the surface layer portion of the n$^-$ type semiconductor layer 2. The insulating film 5 consists of, for example, a silicon oxide film.

A parameter a1 shown in FIG. 2 represents the element interval of the first example of the conventional trench gate type power MOSFET.

FIG. 3 is a cross-sectional view of a second example of the conventional trench gate type power MOSFETs. FIG. 4 is a plan view of the semiconductor substrate surface of the second example of the conventional trench gate type power MOSFETs. It is noted that FIG. 3 is a cross-sectional view taken along line EE' of FIG. 4 and that FIG. 4 is a plan view of the semiconductor substrate surface in a state in which source electrodes on the semiconductor substrate surface are eliminated so as to facilitate understanding.

A parameter a2 shown in FIG. 4 represents the element interval of the second example of the conventional trench gate type power MOSFET.

The second example of the conventional trench gate type power MOSFET is equal in configuration to the first example except that the element interval a2 is twice as high as the element interval a1 of the first example.

The element characteristic index Ron·Qgd stated above will now be considered. The gate-drain electric charges Qgd during switching increase proportionally to the density of the gate. Therefore, if the element interval is, for example, doubled as in the case of the element interval of the second example of the conventional trench gate type power MOSFET relative to that of the first example, the gate-drain electric charges Qgd during switching are halved.

On the other hand, the components of the ON resistance Ron are divided to a channel resistance and an epitaxial layer resistance. The ratio of the channel resistance to the epitaxial layer resistance of the first example of the conventional trench gate type power MOSFET is 1:1. If the element interval is doubled, the channel resistance is doubled but the epitaxial layer resistance remains the same. As a result, the overall ON resistance Ron of the element is increased to 4/3 times.

Accordingly, as in the case of the second example relative to the first example of the conventional trench gate type power MOSFET, the element characteristic index Ron·Qgd can be decreased to 2/3 times by doubling the element interval.

However, the trench gate type power MOSFET having the high element interval has a disadvantage of low unclumped inductive switching capability during switching if an inductor is a load.

SUMMARY OF THE INVENTION

A semiconductor device according to the first embodiment of the present invention comprises:
 a semiconductor substrate of a first conductive type;
 a semiconductor layer of the first conductive type formed on the semiconductor substrate;
 a base layer of a second conductive type formed on the semiconductor layer;
 a plurality of columns of stripe trenches formed at predetermined intervals from a surface of the base layer by a predetermined depth;
 insulating films formed on side surfaces and bottoms of the trenches, respectively;

source layers of the first conductive type formed on surface layer portions of the base layer between the trenches, respectively;

stripe contact layers of the second conductive type formed each at centers of the surface layer portions of the base layer between the trenches, respectively;

a gate electrode formed in every other trench among the plurality of columns of trenches;

source electrodes formed in the trenches other than the trenches in which the gate electrodes are formed and on the source layers and the contact layers, respectively; and a drain electrode formed on a rear surface of the semiconductor substrate.

A semiconductor device according to the second embodiment of the present invention comprises:

a semiconductor substrate of a first conductive type;

a semiconductor layer of the first conductive type formed on the semiconductor substrate;

a base layer of a second conductive type formed on the semiconductor layer;

a plurality of columns of stripe trenches formed at predetermined intervals from a surface of the base layer by a predetermined depth;

insulating films formed on side surfaces and bottoms of the trenches, respectively;

gate electrodes formed in every two columns of the respective trenches among the plurality of columns of trenches;

source layers of the first conductive type formed on surface layer portions of the base layer adjacent to the trenches in which the gate electrodes are formed, respectively;

contact layers of the second conductive type formed to be stripe at centers of the surface layer portions of the base layer on which the source layers are formed, and formed on the surface layer portions of the base layer other than the surface layer portions of the base layer on which the source layers are formed, respectively;

source electrodes formed in the trenches other than the trenches in which the gate electrodes are formed and on the source layers and/or the contact layers, respectively; and a drain electrode formed on a rear surface of the semiconductor substrate.

A semiconductor device according to the third embodiment of the present invention comprises:

a semiconductor substrate of a first conductive type;

a semiconductor layer of the first conductive type formed on the semiconductor substrate;

a base layer of a second conductive type formed on the semiconductor layer;

a plurality of columns of stripe trenches formed at predetermined intervals and at wider intervals for every three columns from a surface of the base layer by a predetermined depth;

insulating films formed on side surfaces and bottoms of the trenches, respectively;

gate electrodes formed in the central trenches of the respective three consecutive columns of trenches formed at the predetermined intervals among the plurality of columns of trenches;

source layers of the first conductive type formed on surface layer portions of the base layer adjacent to the trenches in which the gate electrodes are formed, respectively;

contact layers of the second conductive type formed to be stripe at centers of the surface layer portions of the base layer on which each of the source layers is formed, and formed on the surface layer portions of the base layer other than the surface layer portions of the base layer on which the source layers are formed, respectively;

source electrodes formed in the trenches other than the trenches in which the gate electrodes are formed and on the source layers and/or the contact layers, respectively; and a drain electrode formed on a rear surface of the semiconductor substrate.

DETAILED DESCRIPTION OF THE EMBODIMENTS

The embodiments of a semiconductor device according to the present invention will be described hereinafter with reference to the drawings. In the following description, it is considered that the first conductive type is an n type and that the second conductive type is a p type.

Figure 1:
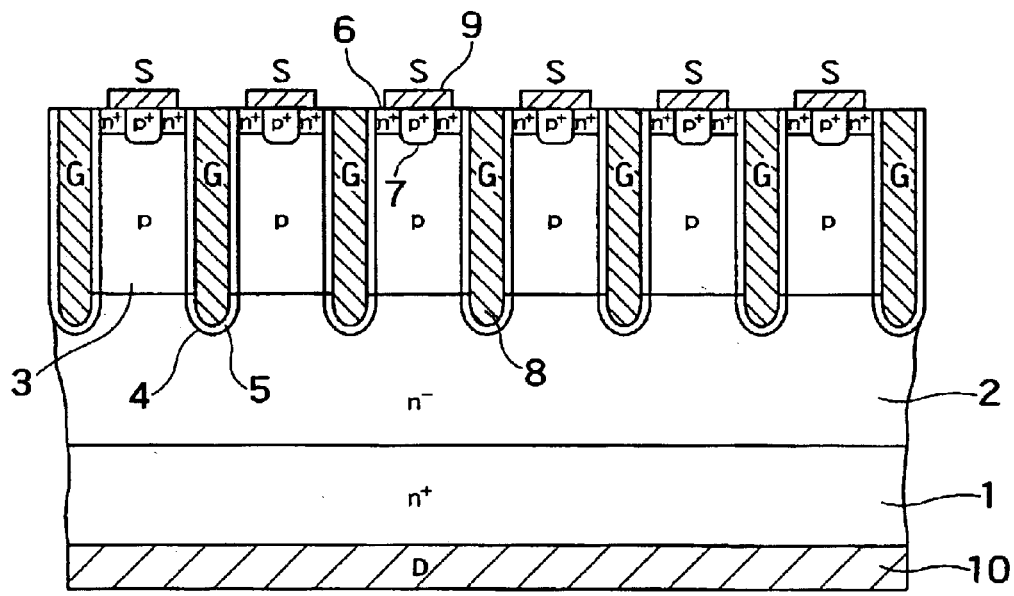
FIG. 1 is a cross-sectional view of a first example of conventional trench gate type power MOSFETs.
Figure 2:
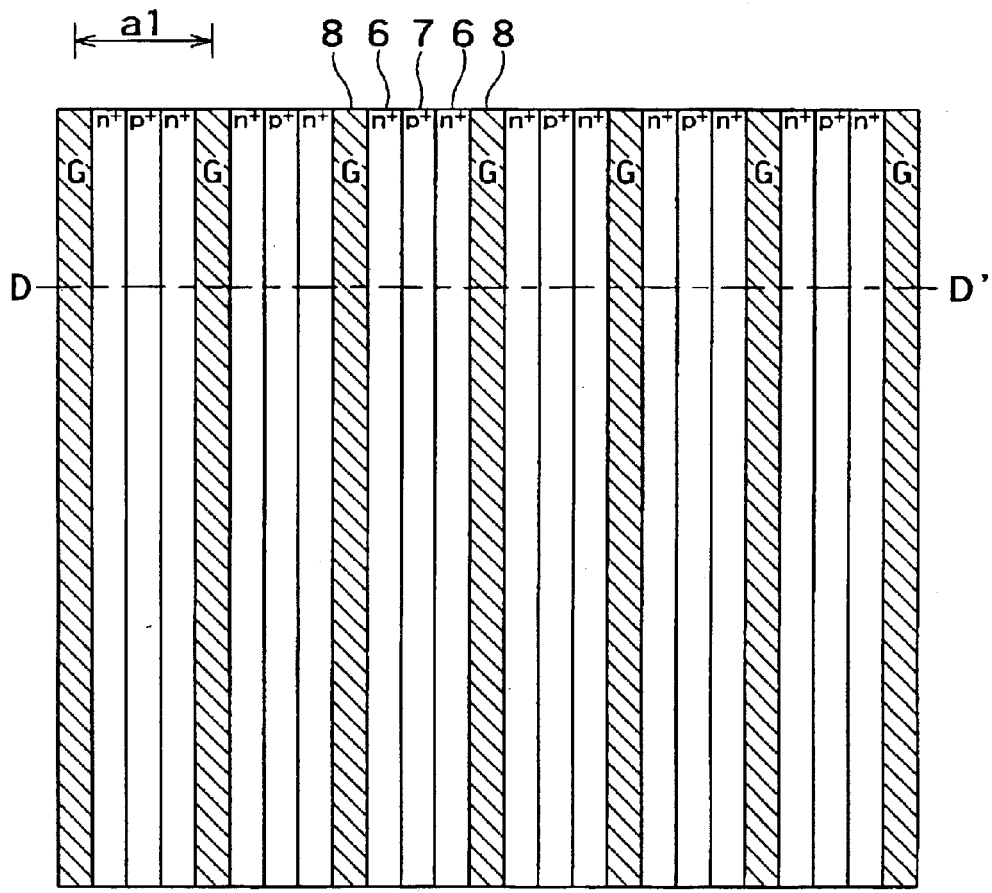
FIG. 2 is a plan view of the surface of the semiconductor substrate of the first example of the conventional trench gate type power MOSFETs.
Figure 3:
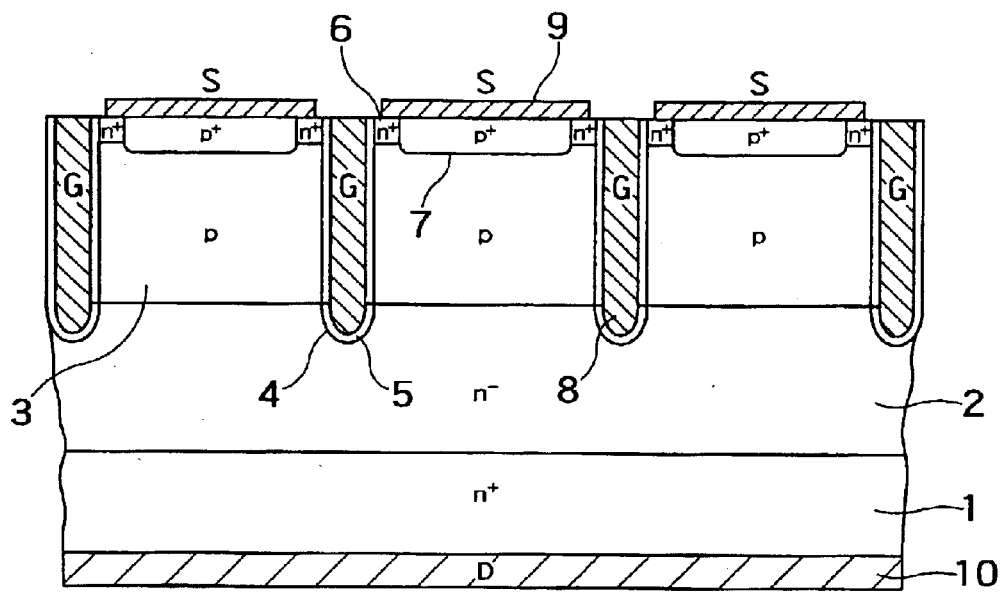
FIG. 3 is a cross-sectional view of a second example of the conventional trench gate type power MOSFETs.
Figure 4:
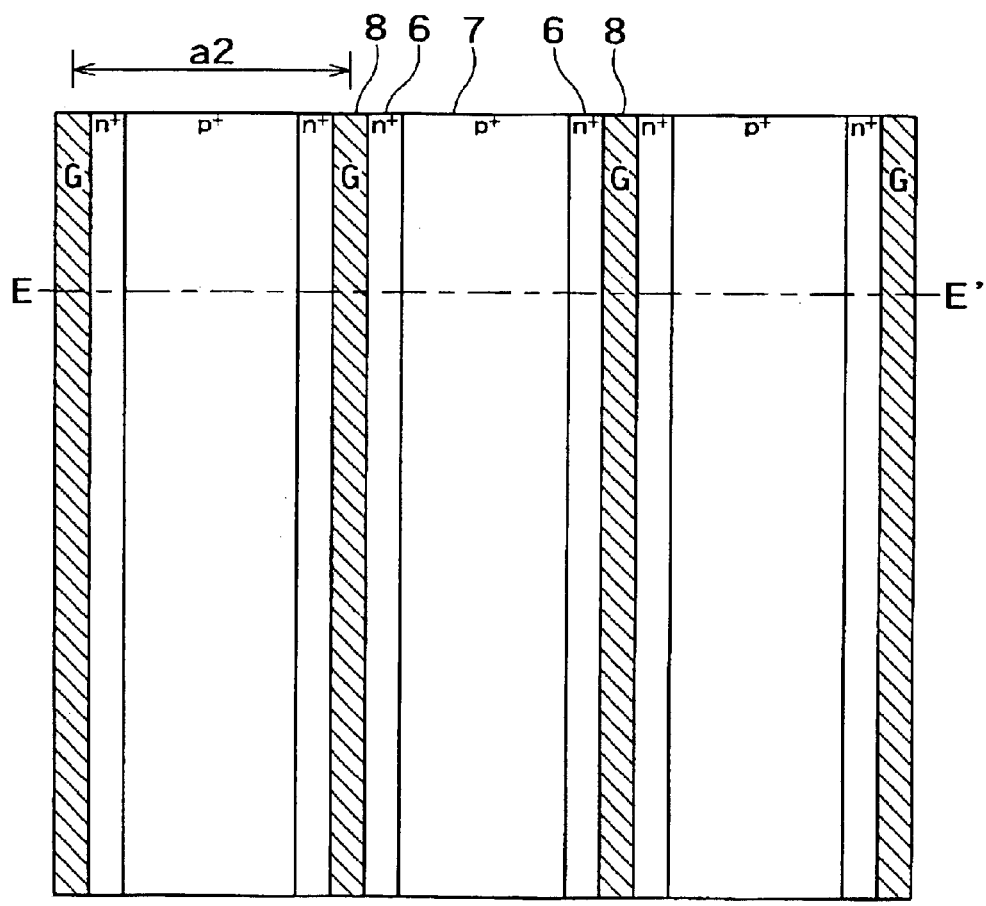
FIG. 4 is a plan view of the surface of the semiconductor substrate of the second example of the conventional trench gate type power MOSFETs.
Figure 5:
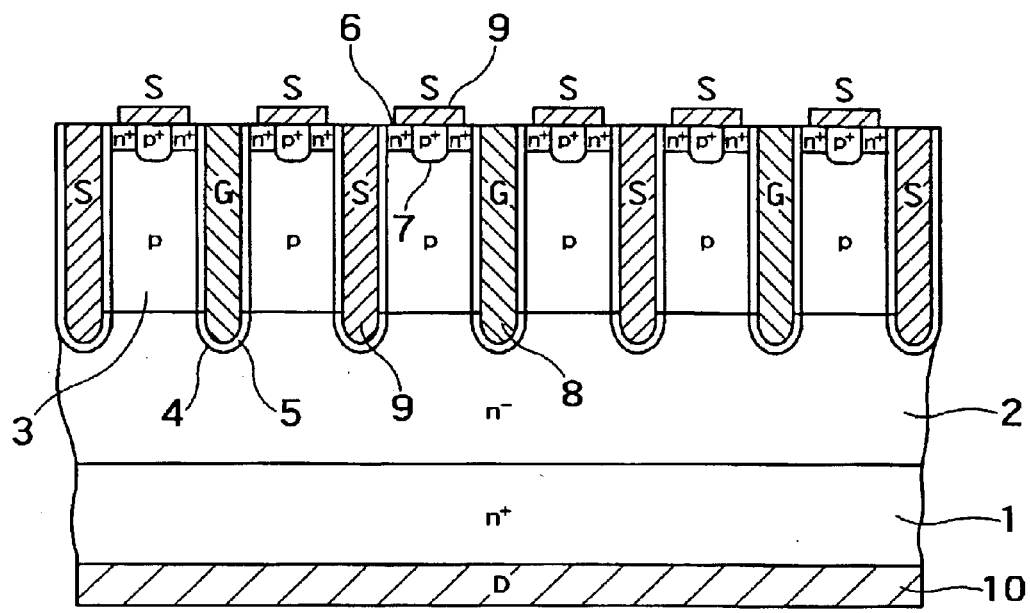
FIG. 5 is a cross-sectional view of a semiconductor device according to a first embodiment of the present invention.
Figure 6:
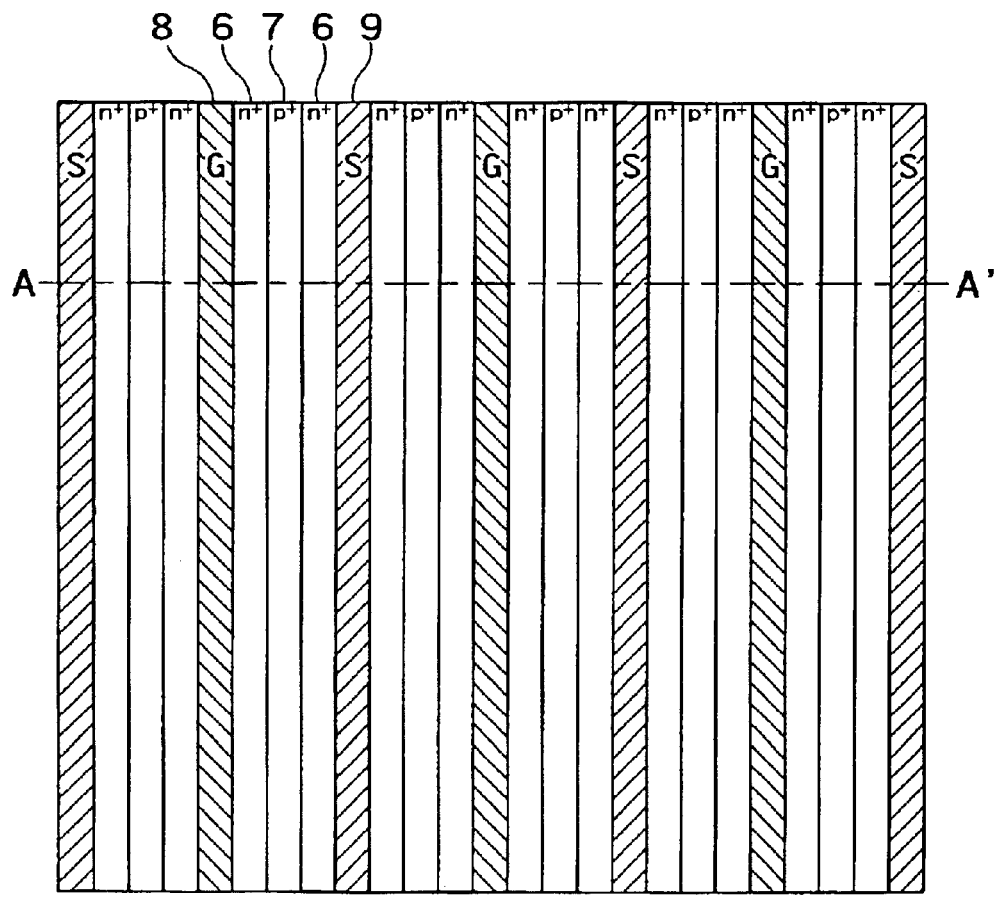
FIG. 6 is a plan view of the surface of the semiconductor substrate of the semiconductor device according to the first embodiment of the present invention.

FIG. 5 is a cross-sectional view of the semiconductor device according to a first embodiment of the present invention. FIG. 6 is a plan view of the semiconductor substrate surface of the semiconductor device according to the first embodiment. It is noted that FIG. 5 is a cross-sectional view taken along line AA' of FIG. 6 and that FIG. 6 is a plan view of the semiconductor substrate surface in a state in which source electrodes on the semiconductor substrate surface are eliminated so as to facilitate understanding.

The semiconductor device according to the first embodiment includes an $n^+$ type semiconductor substrate 1, an $n^-$ type semiconductor layer 2 formed on the $n^+$ type semiconductor substrate 1, a p type base layer 3 formed on the $n^-$ type semiconductor layer 2, a plurality of columns of stripe trenches 4 formed at predetermined intervals from the surface of the p type base layer 3 by a predetermined depth, insulating films 5 formed on the side surfaces and bottoms of the respective trenches 4, $n^+$ type source layers 6 formed on the surface layer portions of the p type base layer 3 between the respective trenches 4, stripe $p^+$ contact layers 7 formed at the center of the surface layer portions of the p type base layer 3 between the respective trenches 4, a gate electrode 8 formed in every other trench of the plurality of trenches 4, source electrodes 9 formed in the trenches 4 other than the trenches 4 in which the gate electrodes 8 are formed and formed on the $n^+$ type source layers 6 and $p^+$ type contact layers 7, respectively, and a drain electrode 10 formed on the rear surface of the $n^+$ type semiconductor substrate 1.

The $n^-$ type semiconductor layer 2 consists of, for example, an epitaxial layer formed by epitaxial growth. As shown in FIG. 5, for example, each stripe trench 4 has a depth from the surface of the p type base layer 3 to the surface layer portion of the $n^-$ type semiconductor layer 2. The insulating film 5 consists of, for example, a silicon oxide film.

In the semiconductor device according to the first embodiment of the present invention, a plurality of stripe trenches 4 are formed at the equivalent interval to that of the conventional, ordinary trench gate type power MOSFET, and the gate electrodes 8 and the source electrodes 9 are formed alternately in the columns of trenches 4.

With this configuration, since the interval of the trenches 4 is equivalent to that of the conventional, ordinary trench gate type power MOSFET, it is possible to maintain an equivalently high unclumped inductive switching capability to that of the conventional, ordinary trench gate type power MOSFET. On the other hand, the interval of the gate electrodes 8, i.e., the element interval is twice as high as that of the conventional, ordinary trench gate type power MOSFET. It is, therefore, possible to decrease the element characteristic index Ron·Qgd and to thereby decrease the driving voltage, the ON resistance and switching loss of the element or MOSFET.

Figure 7:
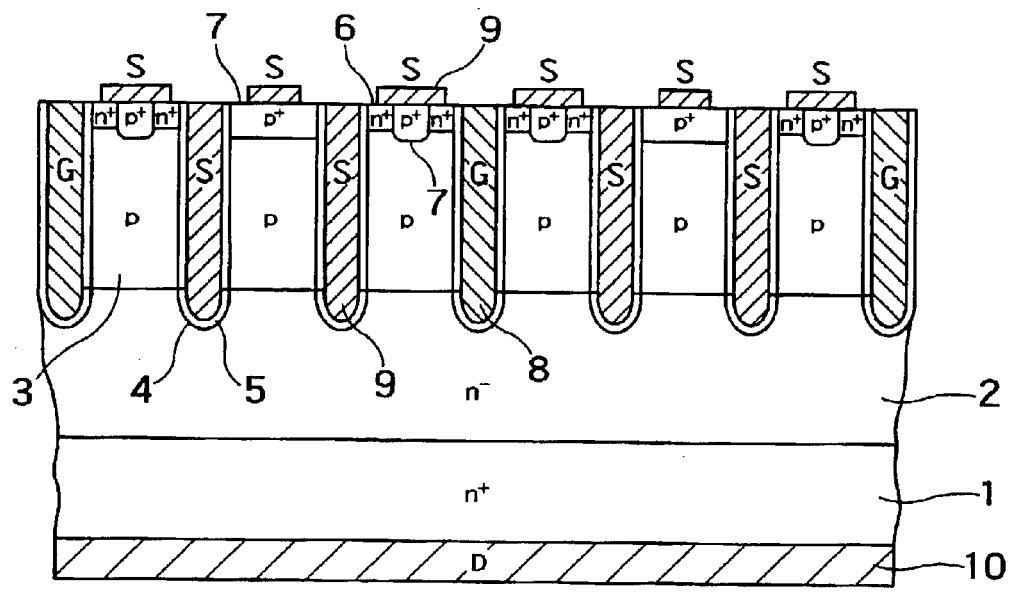
FIG. 7 is a cross-sectional view of the semiconductor device according to a second embodiment of the present invention.
Figure 8:
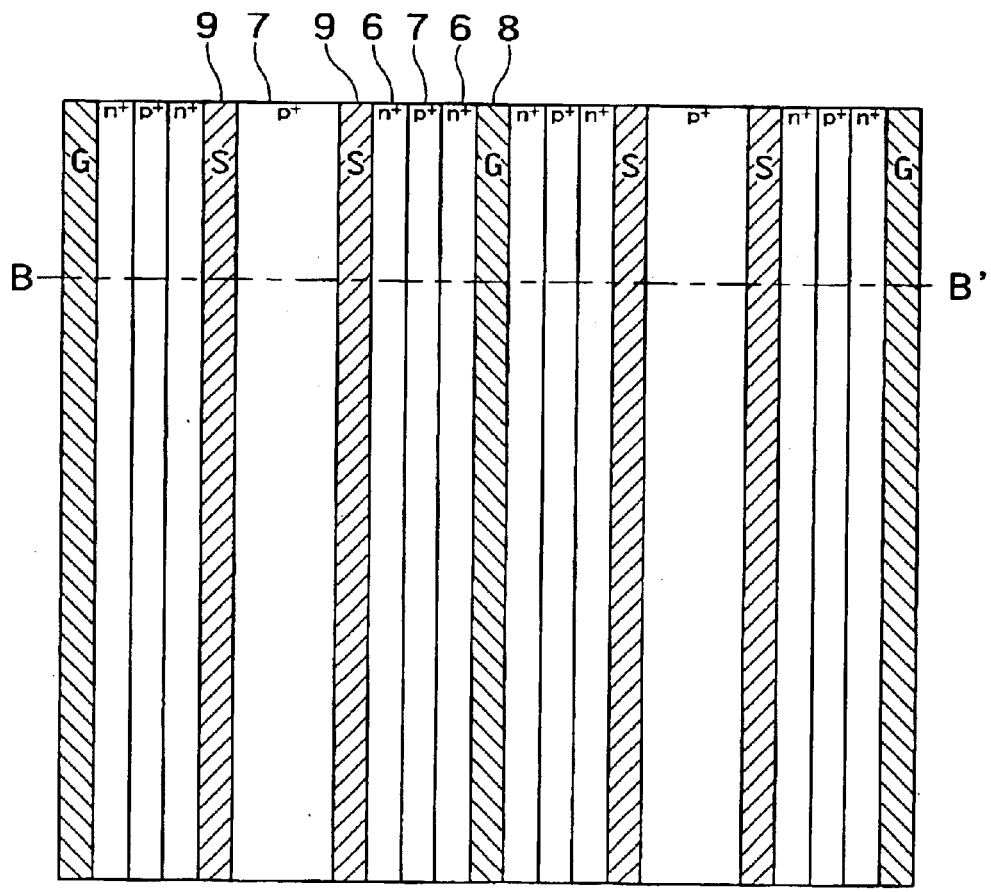
FIG. 8 is a plan view of the surface of the semiconductor substrate of the semiconductor device according to the second embodiment of the present invention.

FIG. 7 is a cross-sectional view of the semiconductor device according to a second embodiment of the present invention. FIG. 8 is a plan view of the semiconductor substrate surface of the semiconductor device according to the second embodiment. It is noted that FIG. 7 is a cross-sectional view taken along line BB' of FIG. 8 and that FIG. 8 is a plan view of the semiconductor substrate surface in a state in which source electrodes on the semiconductor substrate surface are eliminated so as to facilitate understanding.

The semiconductor device according to the second embodiment of the invention includes an $n^+$ type semiconductor substrate 1, an $n^-$ type semiconductor layer 2 formed on the $n^+$ type semiconductor substrate 1, a p type base layer 3 formed on the $n^-$ type semiconductor layer 2, a plurality of columns of stripe trenches 4 formed at predetermined intervals from the surface of the p type base layer 3 by a predetermined depth, insulating films 5 formed on the side surfaces and bottoms of the respective trenches 4, gate electrodes 8 formed in every two columns of trenches 4 among the plurality of trenches 4, $n^+$ type source layers 6 formed on the surface layer portions of the p type base layer 3 adjacent to the respective trenches 4 in which the gate electrodes 8 are formed, $p^+$ contact layers 7 which are formed to be stripe at the center of the surface layer portions of the p type base layer 3 on which the $n^+$ source layers 6 are formed and which layers 7 are formed on surface layer portions of the p type base layer 3 other than those on which the $n^+$ source layers 6 are formed, source electrodes 9 formed in the trenches 3 other than those in which the gate electrodes 8 are formed and on the $n^+$ type source layers 6 and/or $p^+$ type contact layers 7, respectively, and a drain electrode 10 formed on the rear surface of the $n^+$ type semiconductor substrate 1.

The $n^-$ type semiconductor layer 2 consists of, for example, an epitaxial layer formed by epitaxial growth. As shown in FIG. 7, for example, each stripe trench 4 has a depth from the surface of the p type base layer 3 to the surface layer portion of the $n^-$ type semiconductor layer 2. The insulating film 5 consists of, for example, a silicon oxide film.

In the semiconductor device according to the second embodiment of the present invention, a plurality of stripe trenches 4 are formed at the equivalent interval to that of the conventional, ordinary trench gate type power MOSFET, the gate electrodes 8 are formed in every two columns of trenches 4, and the source electrodes 9 are formed in the remaining trenches 4.

With this configuration, since the interval of the trenches 4 is equivalent to that of the conventional, ordinary trench gate type power MOSFET, it is possible to maintain an equivalently high unclumped inductive switching capability to that of the conventional, ordinary trench gate type power MOSFET as in the case of the first embodiment. On the other hand, the interval of the gate electrodes 8, i.e., the element interval is three times as high as that of the conventional, ordinary trench gate type power MOSFET. It is, therefore, possible to further decrease the element characteristic index Ron·Qgd and to thereby further decrease the driving voltage, the ON resistance and the switching loss of the element or MOSFET as compared with the first embodiment.

Figure 9:
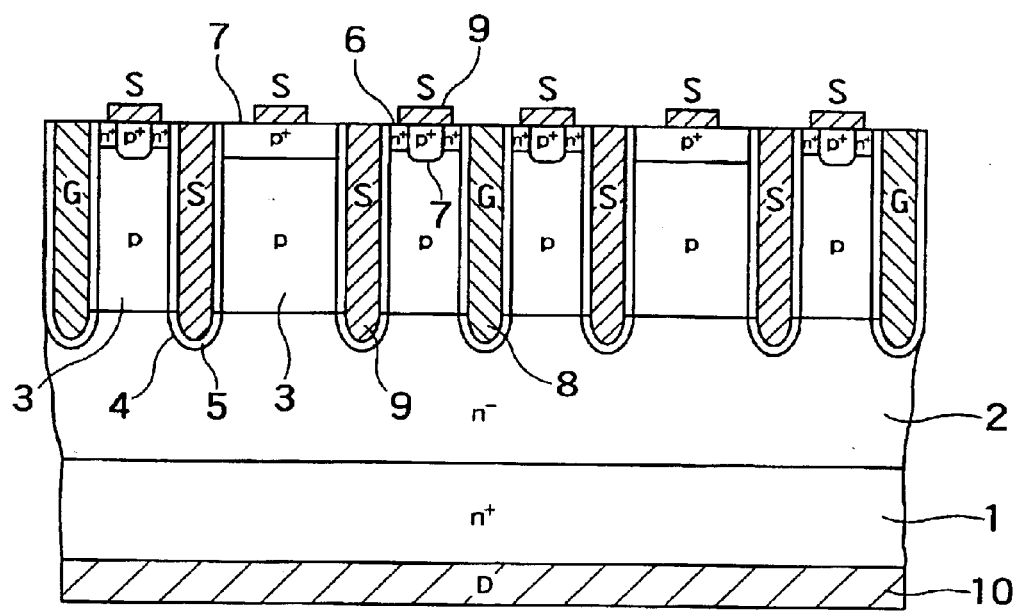
FIG. 9 is a cross-sectional view of the semiconductor device according to a third embodiment of the present invention.
Figure 10:
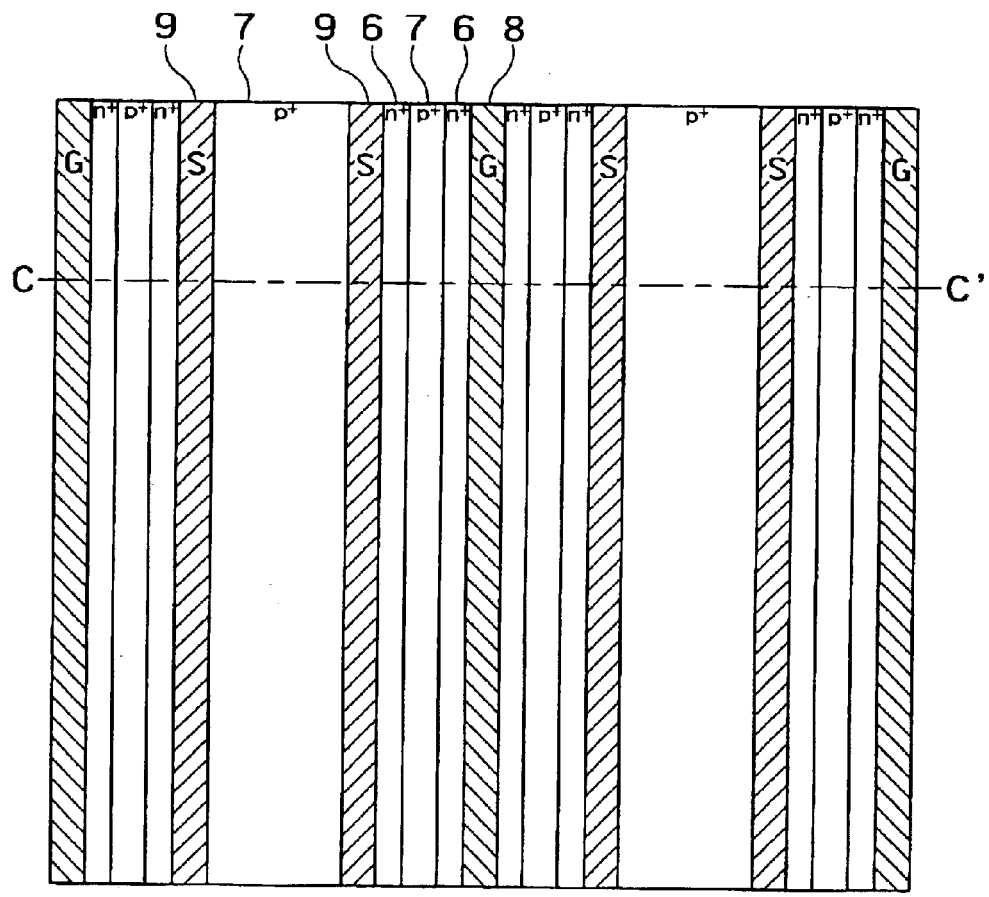
FIG. 10 is a plan view of the surface of the semiconductor substrate of the semiconductor device according to the third embodiment of the present invention.

FIG. 9 is a cross-sectional view of the semiconductor device according to the third embodiment of the present invention. FIG. 10 is a plan view of the semiconductor substrate surface of the semiconductor device according to a third embodiment. It is noted that FIG. 9 is a cross-sectional view taken along line CC' of FIG. 10 and that FIG. 10 is a plan view of the semiconductor substrate surface in a state in which source electrodes on the semiconductor substrate surface are eliminated so as to facilitate understanding.

The semiconductor device according to the third embodiment includes an $n^+$ type semiconductor substrate 1, an $n^-$ type semiconductor layer 2 formed on the $n^+$ type semiconductor substrate 1, a p type base layer 3 formed on the $n^-$ type semiconductor layer 2, a plurality of columns of stripe trenches 4 formed at predetermined intervals and at wider intervals for every three columns from the surface of the p type base layer 3 by a predetermined depth, insulating films 5 formed on the side surfaces and bottoms of the respective trenches 4, gate electrodes 8 formed in the respective central trenches 4 of the respective three consecutive columns of trenches 4 formed at the predetermined intervals among the plurality of columns of trenches 4, $n^+$ type source layers 6 formed on the surface layer portions of the p type base layer 3 adjacent to the trenches 4 in which the gate electrodes 8 are formed, $p^+$ contact layers 7 which are formed to be stripe at the center of the surface layer portions of the p type base layer 3 on which the $n^+$ type source layers 6 are formed and which layers 7 are formed on the surface layer portions of the p type base layers 3 other than those on which the $n^+$ type source layers 6 are formed, source electrodes 9 formed in the trenches 4 other than those in which the gate electrodes 8 are formed and on the n$^+$ type source layers 6 and/or p$^+$ type contact layers 7, respectively, and a drain electrode 10 formed on the rear surface of the n$^+$ type semiconductor substrate 1.

The n$^-$ type semiconductor layer 2 consists of, for example, an epitaxial layer formed by epitaxial growth. As shown in FIG. 9, for example, each stripe trench 4 has a depth from the surface of the p type base layer 3 to the surface layer portion of the n$^-$ type semiconductor layer 2. The insulating film 5 consists of, for example, a silicon oxide film.

In the semiconductor device according to the third embodiment of the present invention, a plurality of stripe trenches 4 are formed at the equivalent interval to that of the conventional, ordinary trench gate type power MOSFET and at wider intervals for every three columns of trenches, the gate electrodes 8 are formed in the central trenches 4 of the respective three consecutive columns of trenches 4 formed at the predetermined intervals among the plurality of trenches 4, and the source electrodes 9 are formed in the remaining trenches 4.

With this configuration, since the interval of the three consecutive columns of trenches 4 with the gate electrode 8 formed in the central trench 4 is equivalent to that of the conventional, ordinary trench gate type power MOSFET, it is possible to maintain an equivalently high unclumped inductive switching capability to that of the conventional, ordinary trench gate type power MOSFET as in the case of the first embodiment. On the other hand, since the trenches 4 are formed at wider intervals for every three columns, the interval of the gate electrodes 8, i.e., the element interval is higher than that in the second embodiment in which the element interval is three times as high as that of the conventional, ordinary trench gate type power MOSFET. It is, therefore, possible to further decrease the element characteristic index Ron·Qgd and to thereby further decrease the driving voltage, the ON resistance and switching loss of the element or MOSFET.

What is claimed is:

1. A semiconductor device comprising:
   a semiconductor substrate of a first conductive type;
   a semiconductor layer of the first conductive type formed on said semiconductor substrate;
   a base layer of a second conductive type formed on said semiconductor layer;
   a plurality of columns of stripe trenches formed at predetermined intervals from a surface of said base layer by a predetermined depth;
   insulating films formed on side surfaces and bottoms of said trenches, respectively;
   source layers of the first conductive type formed on surface layer portions of said base layer between said trenches, respectively;
   stripe contact layers of the second conductive type formed each at centers of the surface layer portions of said base layer between said trenches, respectively;
   a gate electrode formed in every other trench among said plurality of columns of trenches;
   source electrodes formed in said trenches other than the trenches in which said gate electrodes are formed and on said source layers and said contact layers, respectively; and
   a drain electrode formed on a rear surface of said semiconductor substrate.

2. The semiconductor device according to claim 1, wherein the predetermined depth of each of said trenches is a depth from the surface of said base layer to a surface layer portion of said semiconductor layer.

3. The semiconductor device according to claim 1, wherein said semiconductor layer is an epitaxial layer.

4. The semiconductor device according to claim 1, wherein said insulating film is a silicon oxide film.

5. The semiconductor device according to claim 1, wherein said first conductive type is an n type, and said second conductive type is a p type.

6. A semiconductor device comprising:
   a semiconductor substrate of a first conductive type;
   a semiconductor layer of the first conductive type formed on said semiconductor substrate;
   a base layer of a second conductive type formed on said semiconductor layer;
   a plurality of columns of stripe trenches formed at predetermined intervals from a surface of said base layer by a predetermined depth;
   insulating films formed on side surfaces and bottoms of said trenches, respectively;
   gate electrodes formed in every two columns of the respective trenches among said plurality of columns of trenches;
   source layers of the first conductive type formed on surface layer portions of said base layer adjacent to the trenches in which said gate electrodes are formed, respectively;
   contact layers of the second conductive type formed to be stripe at centers of the surface layer portions of the base layer on which said source layers are formed, and formed on the surface layer portions of said base layer other than the surface layer portions of the base layer on which said source layers are formed, respectively;
   source electrodes formed in said trenches other than the trenches in which said gate electrodes are formed and on said source layers and/or said contact layers, respectively; and
   a drain electrode formed on a rear surface of said semiconductor substrate.

7. The semiconductor device according to claim 6, wherein the predetermined depth of each of said trenches is a depth from the surface of said base layer to a surface layer portion of said semiconductor layer.

8. The semiconductor device according to claim 6, wherein said semiconductor layer is an epitaxial layer.

9. The semiconductor device according to claim 6, wherein said insulating film is a silicon oxide film.

10. The semiconductor device according to claim 6, wherein said first conductive type is an n type, and said second conductive type is a p type.

11. A semiconductor device comprising:
    a semiconductor substrate of a first conductive type;
    a semiconductor layer of the first conductive type formed on said semiconductor substrate;
    a base layer of a second conductive type formed on said semiconductor layer;
    a plurality of columns of stripe trenches formed at predetermined intervals and at wider intervals for every three columns from a surface of said base layer by a predetermined depth;
    insulating films formed on side surfaces and bottoms of said trenches, respectively;

gate electrodes formed in the central trenches of the respective three consecutive columns of trenches formed at said predetermined intervals among said plurality of columns of trenches;

source layers of the first conductive type formed on surface layer portions of said base layer adjacent to the trenches in which said gate electrodes are formed, respectively;

contact layers of the second conductive type formed to be stripe at centers of the surface layer portions of the base layer on which each of said source layers is formed, and formed on the surface layer portions of said base layer other than the surface layer portions of the base layer on which said source layers are formed, respectively;

source electrodes formed in said trenches other than the trenches in which said gate electrodes are formed and on said source layers and/or said contact layers, respectively; and a drain electrode formed on a rear surface of said semiconductor substrate.

12. The semiconductor device according to claim 11, wherein the predetermined depth of each of said trenches is a depth from the surface of said base layer to a surface layer portion of said semiconductor layer.

13. The semiconductor device according to claim 11, wherein said semiconductor layer is an epitaxial layer.

14. The semiconductor device according to claim 11, wherein said insulating film is a silicon oxide film.

15. The semiconductor device according to claim 11, wherein said first conductive type is an n type, and said second conductive type is a p type.

* * * * *